US012763727B2

(12) United States Patent
Fujie

(10) Patent No.: US 12,763,727 B2
(45) Date of Patent: Oct. 13, 2026

(54) OSCILLATION MODULE AND ATOMIC OSCILLATOR

(71) Applicant: SEIKO EPSON CORPORATION, Tokyo (JP)

(72) Inventor: Masahiro Fujie, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 19/040,071

(22) Filed: Jan. 29, 2025

(65) Prior Publication Data

US 2025/0247051 A1 Jul. 31, 2025

(30) Foreign Application Priority Data

Jan. 29, 2024 (JP) ................................ 2024-010786

(51) Int. Cl.
*H03B 17/00* (2006.01)
*G04F 5/14* (2006.01)

(52) U.S. Cl.
CPC ............... *H03B 17/00* (2013.01); *G04F 5/14* (2013.01); *G04F 5/145* (2013.01)

(58) Field of Classification Search
CPC ............ H03B 17/00; G04F 5/14; G04F 5/145
USPC ............................................ 331/187, 94.1, 3
See application file for complete search history.

(56) References Cited

U.S. PATENT DOCUMENTS

2010/0321117 A1 12/2010 Gan
2014/0247094 A1* 9/2014 Englund .................. H03L 7/00 331/94.1

FOREIGN PATENT DOCUMENTS

JP 2011526744 A 10/2011
WO WO-2009098686 A2 * 8/2009 ............... H03L 7/26

OTHER PUBLICATIONS

Hu et al (Year: 2023)Multipoint Lock-in Detection for Diamond Nitrogen-Vacancy Magnetometry Using DDS-Based Frequency-Shift Keying Qidi Hu(Micromachines).*

Barry et al., “Sensitivity optimization for NV-diamond magnetometry”, Reviews of Modern Physics, Mar. 31, 2020, 74 Pages, vol. 92, American Physical Society.

* cited by examiner

*Primary Examiner* — Arnold M Kinkead
(74) *Attorney, Agent, or Firm* — CHIP LAW GROUP

(57) ABSTRACT

Provided is an oscillation module including a substrate having a defect of an impurity and a vacancy, a plurality of electrodes provided on the substrate and configured to generate an electric field when being applied with a voltage, a light source configured to emit excitation light for exciting the defect to the substrate, and a photodetector configured to detect fluorescence emitted from the substrate. By using such an oscillation module, it is possible to implement an atomic oscillator with high accuracy which is small in size and low in power consumption.

8 Claims, 7 Drawing Sheets

OSCILLATION MODULE AND ATOMIC OSCILLATOR

The present application is based on, and claims priority from JP Application Serial Number 2024-010786, filed Jan. 29, 2024, the disclosure of which is hereby incorporated by reference herein in its entirety.

BACKGROUND

1. Technical Field

The present disclosure relates to an oscillation module and an atomic oscillator.

2. Related Art

Atomic oscillators of various configurations have been used in the past. Examples of such an atomic oscillator include an atomic oscillator using a gas cell filled with an alkali metal such as cesium or rubidium. While the atomic oscillator using the gas cell is highly accurate, the use of the gas cell filled with gas tends to result in large size, high power consumption, and high costs. For example, JP-T-2011-526744 proposes a solid atomic clock device that generates a clock frequency signal based on a hyperfine structure of color centers.

For example, the color center is typically a nitrogen-vacancy center in a diamond crystal. However, in the nitrogen-vacancy center in the diamond crystal, there is no energy level having a small fluctuation with respect to a magnetic field fluctuation as in cesium or rubidium in the gas cell. Therefore, in the atomic oscillator using the nitrogen-vacancy center in the diamond crystal as disclosed in JP-T-2011-526744, the energy level may greatly fluctuate due to the reception of an influence of the earth's magnetic field, and accordingly, it may be difficult to oscillate at a stable frequency.

SUMMARY

An oscillation module according to the present disclosure for solving the above problems includes: a substrate having a composite defect of an impurity and a vacancy; a plurality of electrodes provided on the substrate and configured to generate an electric field when being applied with a voltage; a light source configured to emit excitation light for exciting the composite defect to the substrate; and a photodetector configured to detect fluorescence emitted from the substrate.

DESCRIPTION OF EMBODIMENTS

Figure 1:
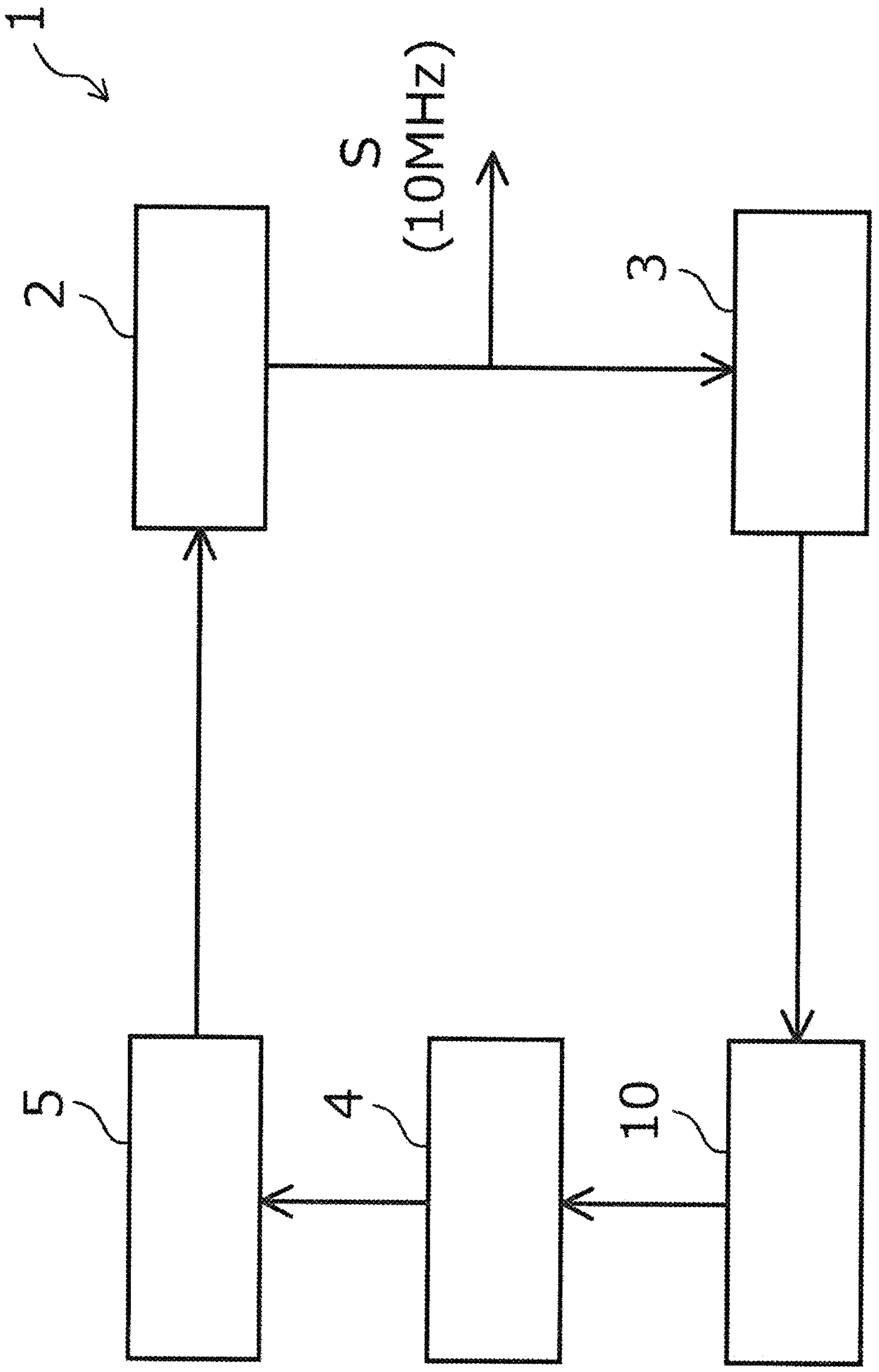
FIG. 1 is a diagram illustrating an atomic oscillator according to an embodiment of the present disclosure.

First, the present disclosure will be schematically described.

An oscillation module according to a first aspect of the present disclosure for solving the above problems includes: a substrate having a composite defect of an impurity and a vacancy; a plurality of electrodes provided on the substrate and configured to generate an electric field when being applied with a voltage; a light source configured to emit excitation light for exciting the composite defect to the substrate; and a photodetector configured to detect fluorescence emitted from the substrate.

According to the present aspect, a substrate having a composite defect of an impurity and a vacancy, a plurality of electrodes provided on the substrate and configured to generate an electric field when being applied with a voltage, a light source configured to emit excitation light for exciting the composite defect to the substrate, and a photodetector configured to detect fluorescence emitted from the substrate are included. With such a configuration, it is possible to prevent the magnetic field dependence of the energy level of the composite defect of the impurity and the vacancy by generating the electric field in the substrate while eliminating the necessity of using the gas to achieve a small size and a low power consumption, and it is possible to perform oscillation at a stable frequency, that is, oscillation with high accuracy in a state of preventing the magnetic field dependence.

The oscillation module according to a second aspect of the present disclosure is an aspect dependent on the first aspect, in which the substrate is a diamond substrate having a nitrogen-vacancy center as the composite defect.

According to the present aspect, the substrate is a diamond substrate having the nitrogen-vacancy center as the composite defect. With such a configuration, it is possible to suitably provide an oscillation module for implementing an atomic oscillator with high accuracy which is small in size and low in power consumption.

The oscillation module according to a third aspect of the present disclosure is an aspect dependent on the first aspect and further includes: a microwave generator configured to generate a microwave based on an input signal received from an outside.

According to the present aspect, a microwave generator configured to generate a microwave based on an input signal received from an outside is included. With such a configuration, an electromagnetic wave in a microwave region serving as the reference signal can be converted, and a decrease in frequency stability can be suitably prevented.

The oscillation module according to a fourth aspect of the present disclosure is an aspect dependent on the third aspect, in which the microwave generator is provided on the substrate.

According to the present aspect, the microwave generator is provided on the substrate. With such a configuration, the electromagnetic wave in the microwave region can be suitably converted.

The oscillation module according to a fifth aspect of the present disclosure is an aspect dependent on the fourth aspect, in which the microwave generator is provided between the electrodes.

According to the present aspect, the microwave generator is provided between the electrodes. With such a configuration, the electromagnetic wave in the microwave region can be particularly suitably converted.

The oscillation module according to a sixth aspect of the present disclosure is an aspect dependent on the fifth aspect, in which the microwave generator is a coiled or linear electric wire.

According to the present aspect, the microwave generator is a coiled or linear electric wire. With such a configuration, the microwave generator having a simple configuration and a small size can be obtained.

The oscillation module according to a seventh aspect of the present disclosure is an aspect dependent on the first aspect, in which the voltage to be applied to the electrodes is a DC voltage.

According to the present aspect, the voltage to be applied to the electrodes is a DC voltage. With such a configuration, the oscillation frequency can be particularly stabilized.

An atomic oscillator according to an eighth aspect of the present disclosure includes: the oscillation module according to any aspect of the first aspect to the seventh aspect; a feedback circuit configured to generate a feedback signal based on a detection signal output from the photodetector; an oscillator configured to adjust an oscillation frequency based on the feedback signal; and a frequency multiplication circuit configured to multiply the oscillation frequency of the oscillator and generate an input signal to be outputted to the oscillation module.

According to the present aspect, the oscillation module described above, the feedback circuit configured to generate a feedback signal based on a detection signal output from the photodetector, the oscillator configured to adjust an oscillation frequency based on the feedback signal, and the frequency multiplication circuit configured to multiply the oscillation frequency of the oscillator and generate an input signal to be outputted to the oscillation module are included. With such a configuration, it is possible to suitably implement an atomic oscillator with high accuracy which is small in size and low in power consumption.

The atomic oscillator according to a ninth aspect of the present disclosure is an aspect dependent on the eighth aspect, in which the oscillation module is an all-solid-state atomic oscillator in which each of components is formed of a solid.

According to the present aspect, the oscillation module is an all-solid-state atomic oscillator in which the component is formed of a solid. With such a configuration, it is possible to particularly suitably implement an atomic oscillator with high accuracy which small in size and low in power consumption.

Hereinafter, an atomic oscillator 1 according to an embodiment of the present disclosure and an oscillation module 10 that can be used in the atomic oscillator 1 will be described with reference to the accompanying drawings. First, a device configuration of the atomic oscillator 1 according to the embodiment will be described with reference to FIG. 1. The device configuration of the atomic: oscillator 1 according to the embodiment follows a configuration of a general cesium or rubidium atomic oscillator. Specifically, the atomic oscillator 1 has substantially the same configuration as that of a general cesium or rubidium atomic oscillator except that the oscillation module 10 which is an all-solid-state atomic oscillator to be described later is used instead of an atomic oscillator using a gas cell.

In the atomic oscillator 1 according to the embodiment, a signal S to be outputted to an outside is oscillated by a controlled oscillator 2. Specifically, the controlled oscillator 2 is assumed to be a crystal oscillator such as a temperature compensated crystal oscillator (TCXO), and a frequency of the signal S is assumed to be about 1 MHz to 10 MHz, such as 10 MHz.

Here, the crystal oscillator may cause frequency drift over time, that is, a gradual change in frequency within a certain time. Therefore, a reference frequency may be prepared, and an oscillation frequency can be feedback corrected according to the reference frequency. A frequency that has been commonly used as the reference frequency is 9.2 GHZ, which is a frequency of a hyperfine structure transition of cesium. In contrast, in the atomic oscillator 1 according to the embodiment, the reference frequency is replaced with 2.87 GHZ which is a resonance frequency of an NV center in a diamond (a nitrogen-vacancy center in a diamond crystal).

That is, in the atomic oscillator 1 according to the embodiment, the oscillation module 10 corresponding to an atomic oscillator portion is replaced with one using diamond instead of one using cesium or the like in the related art. Since the NV center in the diamond also emits fluorescence similarly to cesium, the crystal oscillator can be corrected by converting a change in fluorescence intensity into a frequency shift amount. As described above, since the resonance frequency of the NV center in the diamond is about 2.87 GHz, it is necessary to multiply the oscillation frequency of the crystal oscillator. Therefore, a frequency multiplication circuit 3 is provided in the atomic oscillator 1 according to the embodiment.

Here, the nitrogen-vacancy center in the diamond crystal is a kind of defect that is naturally present in the diamond crystal or is artificially synthesized. The NV center has a structure in which one carbon atom is substituted with nitrogen and an adjacent carbon atom thereof is substituted with a vacancy, and has been studied for applications to various sensors. Since an energy level of the NV center is present in a deep band gap of the diamond, the diamond can be regarded as an isolated atom like cesium or rubidium.

A fluorescence detector 4 in FIG. 1 is for detecting a change in fluorescence intensity of the NV center in the diamond. The fluorescence detector 4 can also be regarded as a photodetector implementing a part of the oscillation module 10. As illustrated in FIG. 1, the atomic oscillator 1 according to the embodiment can perform frequency feedback by a feedback circuit 5 based on a fluorescence amount detected by the fluorescence detector 4. In the atomic oscillator 1 according to the embodiment, the signal S is transmitted in arrow directions in FIG. 1 to perform the frequency feedback while transmitting the signal S to the outside.

Figure 2:
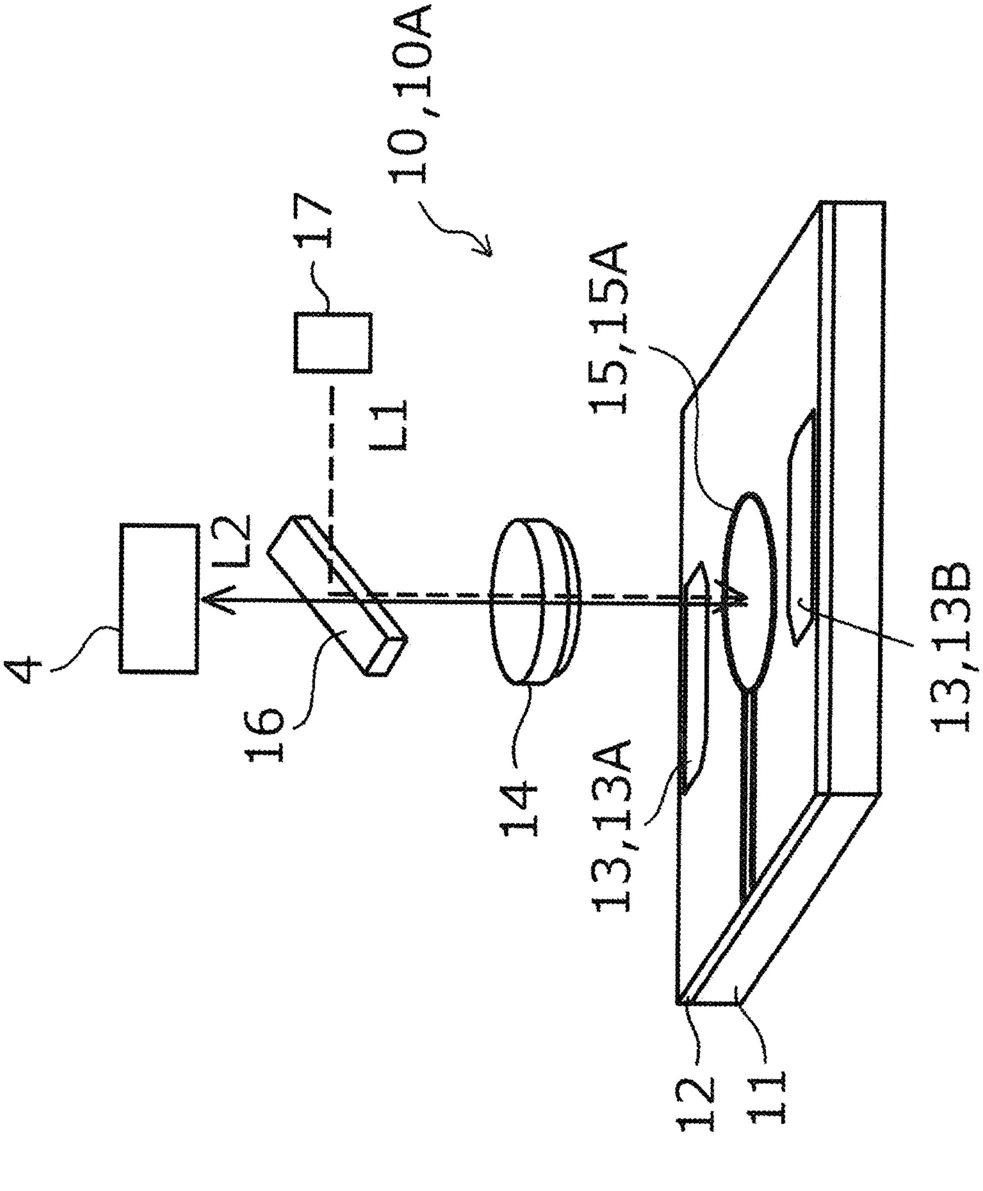
FIG. 2 is a diagram illustrating an oscillation module that can be used in the atomic oscillator in FIG. 1.
Figure 3:
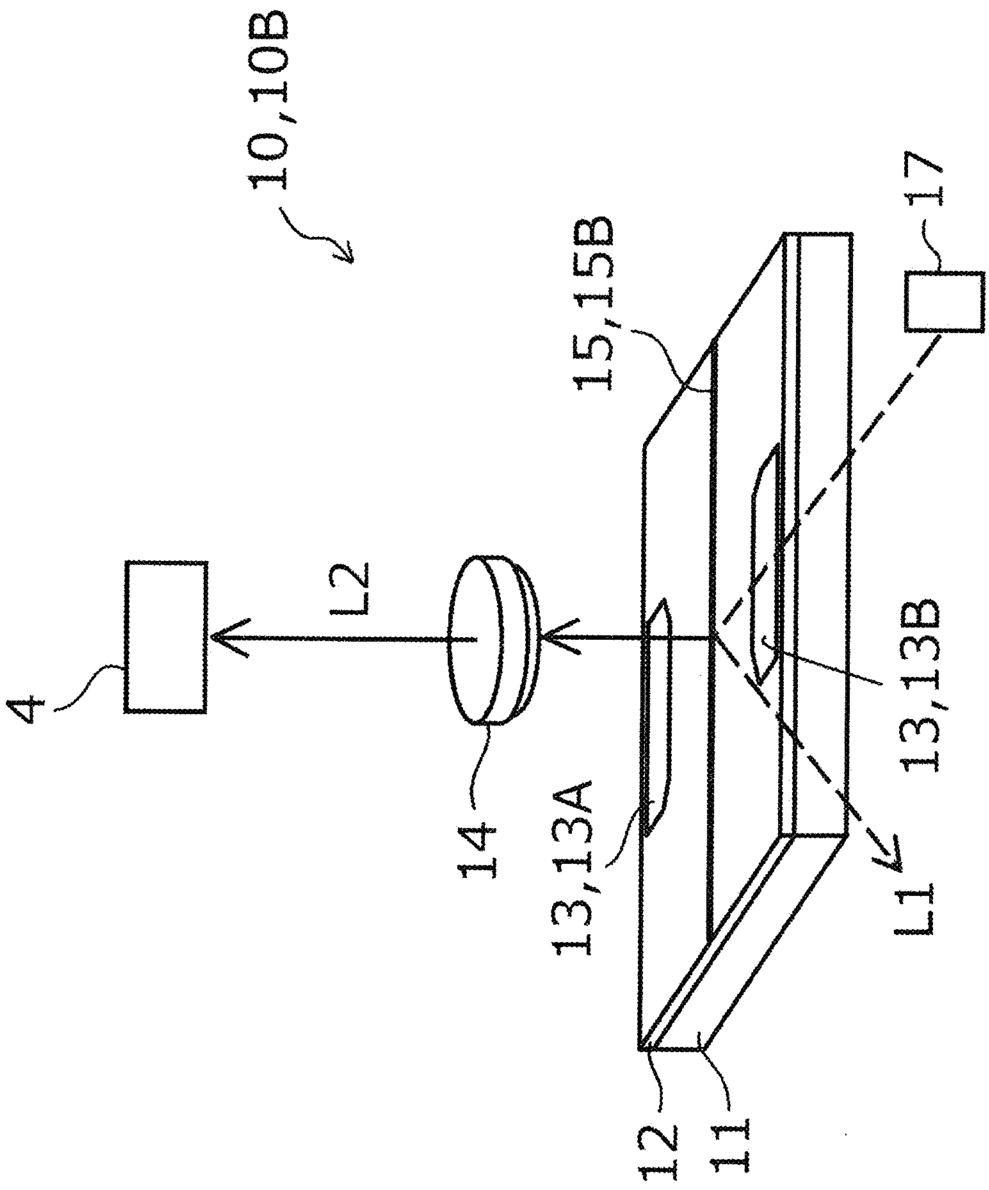
FIG. 3 is a diagram illustrating an oscillation module that has a configuration different from that of the oscillation module in FIG. 2 and that can be used in the atomic oscillator in FIG. 1.

Next, an example of the oscillation module 10 that can be used in the atomic oscillator 1 according to the embodiment will be described with reference to FIGS. 2 and 3. First, an oscillation module 10A in the oscillation module 10 that can be used in the atomic oscillator 1 according to the embodiment will be described with reference to FIG. 2. The oscillation module 10A is an example of an all-solid-state atomic oscillator in which each of components is formed of a solid, and an electrode 13 is formed on a diamond substrate 11 including the nitrogen-vacancy center in the diamond crystal. The electrode 13 includes plurality of electrodes 13A and 13B for generating an electric field when being applied with a voltage, that is, for applying the electric field. A nitrogen-vacancy center containing layer (an NV-containing layer 12) in the diamond crystal is provided on the diamond substrate 11.

The oscillation module 10A applies a microwave serving as a reference signal for constituting the reference frequency by a coil 15A (a coiled electric wire) serving as a microwave generator 15. The oscillation module 10A emits green light L1 from a laser or another light source 17 via, for example, a lens 14 to detect the nitrogen-vacancy center in the diamond crystal. Then, red fluorescence L2 emitted from the nitrogen-vacancy center in the diamond crystal is discriminated by a dichroic mirror 16 in which reflection and transmission characteristics change by a wavelength, and is guided to the fluorescence detector 4. The atomic oscillator 1 according to the embodiment illustrated in FIG. 1 performs the frequency feedback by the feedback circuit 5 based on the fluorescence amount detected by the fluorescence detector 4. If necessary, an electrostatic shield or a magnetic shield may be used to block noise in an external environment.

Since it is important to apply a uniform microwave and electric field to the nitrogen-vacancy center in the diamond crystal, it is desirable that a measurement target nitrogen-vacancy center is located near a center of the coil 15A and near a center of the electrode 13. Therefore, excitation and measurement of the nitrogen-vacancy center in the diamond crystal are also performed near the centers of the coil 15A and the electrode 13. The electric field generated by applying the voltage to the electrode 13 needs to have a component in a plane perpendicular to an axis coupling nitrogen and the vacancy in the nitrogen-vacancy center in the diamond crystal. Therefore, in the case of the configuration of the oscillation module 10A, it is desirable for the diamond to have a (111) plane orientation.

In principle, it is sufficient that there is one nitrogen-vacancy center in the diamond crystal in an emission range of the green light L1. However, to increase an S/N ratio which is a ratio of an output of a sensor to the noise, it is conceivable to measure many nitrogen-vacancy centers in the diamond crystal at once. Here, typical numerical values of the diamond substrate 11 and the like are described below. A size of the diamond substrate 11 can be several mm square. However, the size is just often used in research, and it is not necessarily limited to this size. An NV-containing layer 12 can have a thickness of 1 μm to 100 μm. The nitrogen-vacancy center in the diamond crystal can have a concentration of about $1015/cm^3$ to $1018/cm^3$. The green light L1 can have a wavelength of about 532 nm. The green light L1 can have an intensity of about 10 μW to several hundred mW. The applied electric field can have an intensity of about $10^5$ V/m to $10^8$ V/m.

First, an oscillation module 10B in the oscillation module 10 that can be used in the atomic oscillator 1 according to the embodiment will be described with reference to FIG. 3. Similarly to the oscillation module 10A, in the oscillation module 10B, the electrode 13 is formed on the diamond substrate 11 including the nitrogen-vacancy center in the diamond crystal, and an electric field can be generated by applying a voltage to the electrode 13. In the oscillation module 10B, a microwave serving as a reference signal is applied by a thin wire 15B which is a linear electric wire made of copper or the like, serving as the microwave generator 15.

Similarly to the oscillation module 10A, the oscillation module 10B emits the green light L1 from a laser or another light source 17 to detect the nitrogen-vacancy center in the diamond crystal. However, in the oscillation module 10B, the green light L1 is emitted from the light source 17 to a back surface of the diamond substrate 11 and is totally reflected. The red fluorescence L2 emitted from the nitrogen-vacancy center in the diamond crystal to a surface of the diamond substrate 11 is guided to the fluorescence detector 4 via the lens 14. Here, although not illustrated in the drawing, a band-pass filter for causing red light to pass is provided between the lens L2 and the fluorescence detector 4. The atomic oscillator 1 according to the embodiment illustrated in FIG. 1 performs the frequency feedback by the feedback circuit 5 based on the fluorescence amount detected by the fluorescence detector 4. If necessary, an electrostatic shield or a magnetic shield may be used to block noise in an external environment.

As described above, in the oscillation module 10A and the oscillation module 10B, the microwave generator 15 is provided to apply the microwave. However, such a configuration is not a limitation. For example, the microwave may be applied using a microwave resonator such as a loop-gap resonator. Instead of applying the microwave, two lasers having different frequencies may be incident to cause coherent population trapping (CPT).

As described above, the atomic oscillator 1 according to the embodiment can apply the electric field by the electrode 13. The application of the electric field results in an improvement in frequency accuracy. Therefore, reasons why the application of the electric field results in an improvement in frequency accuracy will be described below.

Figure 4:
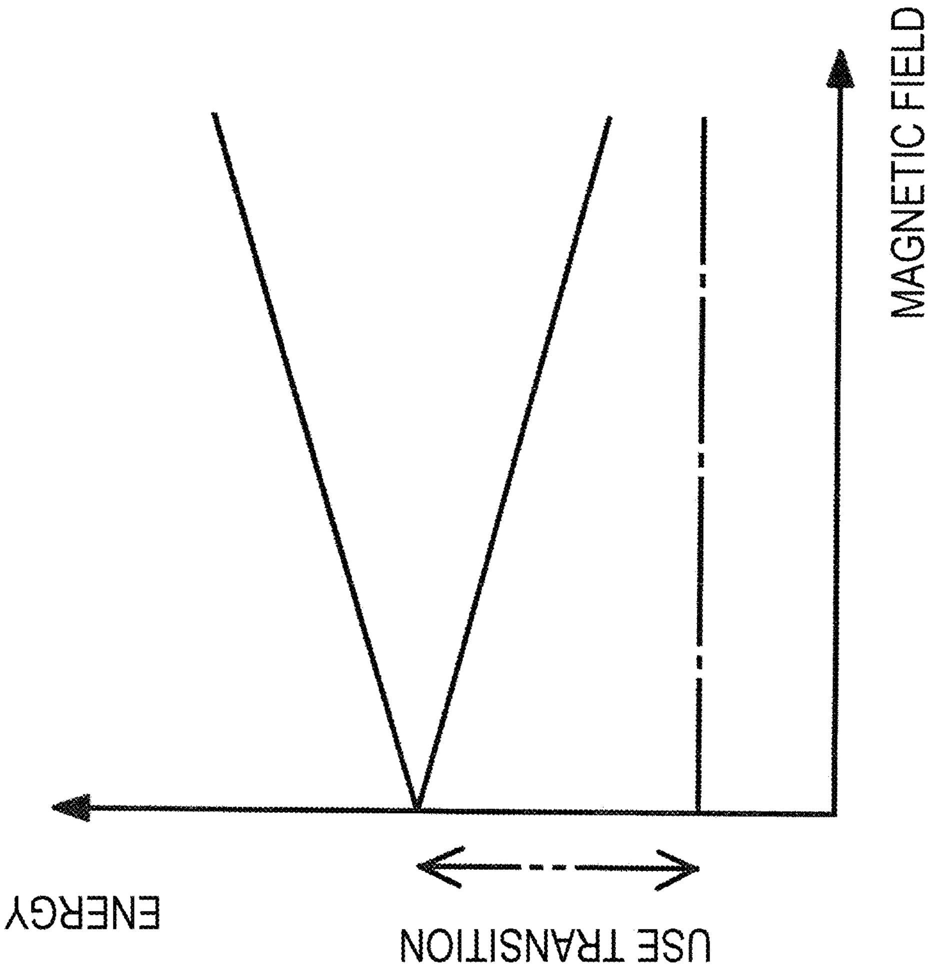
FIG. 4 is a graph illustrating magnetic field dependence of an energy level at a nitrogen-vacancy center in a diamond crystal under a condition that there is no electric field in the atomic oscillator of the embodiment.

First, in the atomic oscillator 1 according to the embodiment, a situation is considered in which only a magnetic field is applied to the nitrogen-vacancy center in the diamond crystal and the electric field is not present. At this time, by Zeeman splitting, a change of the energy level with respect to the magnetic field becomes a straight line having two slopes as indicated by solid lines of a graph in FIG. 4. This means that when the magnetic field fluctuates, the frequency fluctuates accordingly. In other words, the smaller the slope of each of the two straight lines represented by the solid lines is, the better the characteristics of the oscillator are. In the graph in FIG. 4, a dashed line represents reference energy in which a magnetic quantity index insensitive to the magnetic field is zero, and a difference between the solid line and the dashed line corresponds to an energy use transition (transition used as the oscillator), that is, 2.87 GHz which is the resonance frequency of the NV center in the diamond in the atomic oscillator 1 according to the embodiment.

Figure 5:
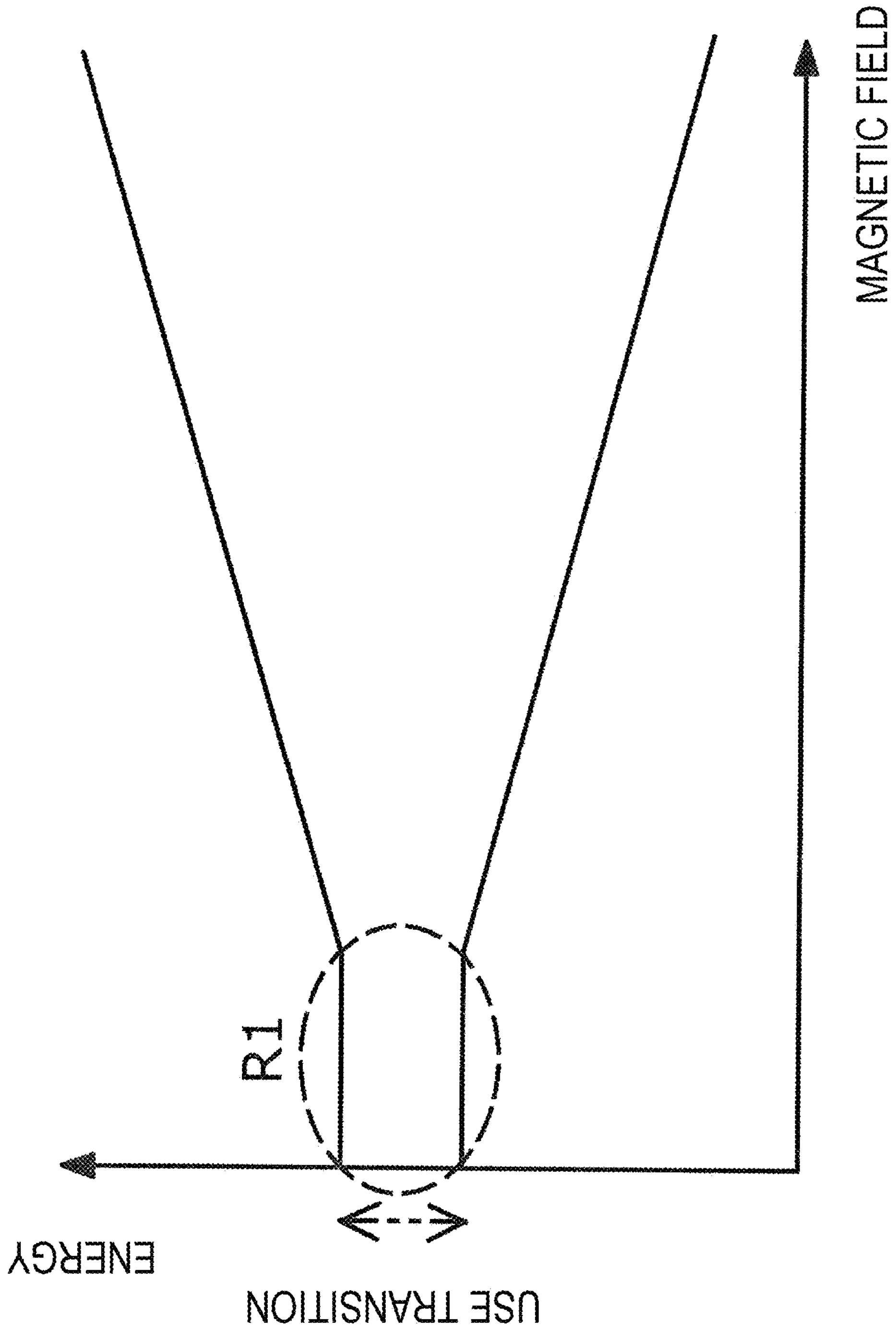
FIG. 5 is a graph illustrating magnetic field dependence of an energy level of cesium atoms in an atomic oscillator of a reference example using a gas cell.

Here, for example, an atomic oscillator including a gas cell using cesium or the like has more excellent characteristics with high accuracy than an atomic oscillator using a nitrogen-vacancy center in a diamond crystal. This is because, in the atomic oscillator including the gas cell using cesium, the energy level changes only in a second order with respect to the magnetic field in the vicinity of the zero magnetic field, as indicated by solid lines in a region represented by a region R1 of a graph in FIG. 5.

Figure 6:
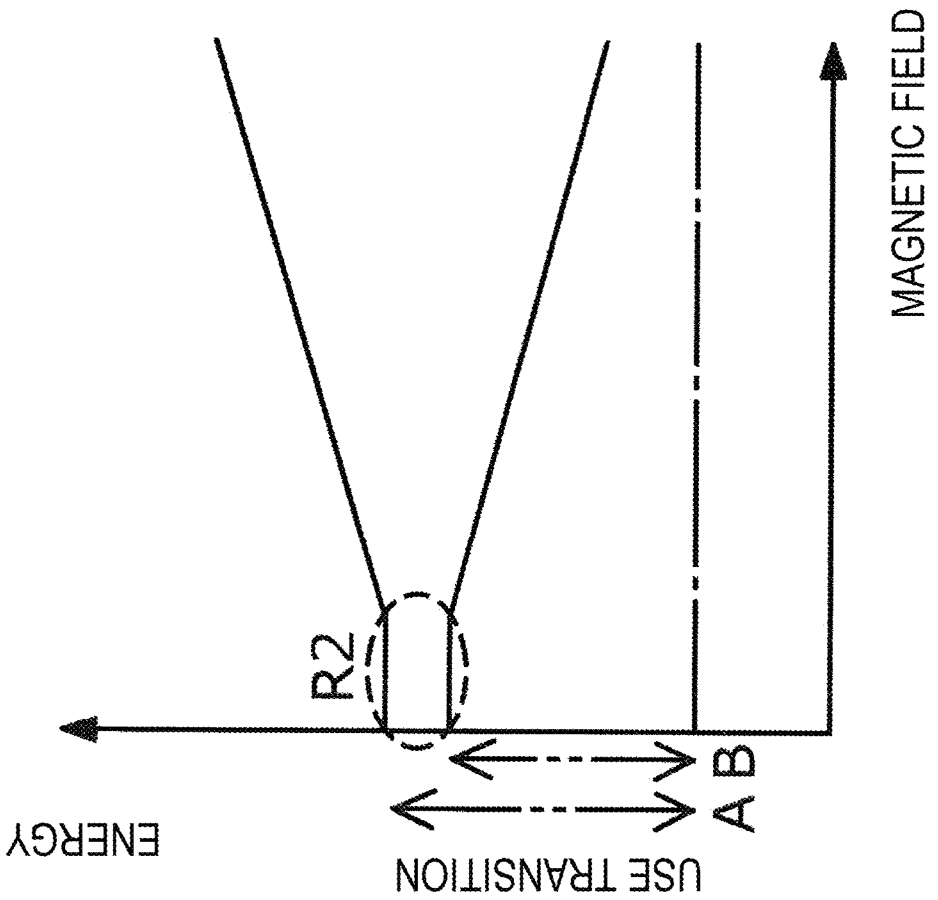
FIG. 6 is a graph illustrating magnetic field dependence of an energy level at a nitrogen-vacancy center in a diamond crystal under a condition that there is an electric field in the atomic oscillator of the embodiment.

Therefore, in the atomic oscillator 1 according to the embodiment, by applying the electric field to the nitrogen-vacancy center in the diamond crystal, the characteristics of the energy level with respect to the magnetic field are brought close to those of cesium. FIG. 6 illustrates an energy level when a constant electric field, in addition to the magnetic field, is applied to the nitrogen-vacancy center in the diamond crystal of the atomic oscillator 1 according to the embodiment. As can be understood from FIG. 6, in the presence of the electric field, the change of the energy level is not linear with respect to the magnetic field, and in the vicinity of the zero magnetic field which is a region represented by a region R2, the energy level changes only in a second order with respect to the magnetic field. That is, by applying the electric field to the nitrogen-vacancy center in the diamond crystal, the same characteristics as those of an atomic oscillator including a gas cell using cesium can be exhibited.

However, a difference between the atomic oscillator 1 according to the embodiment and the atomic oscillator including the gas cell using cesium is that since the electric field is applied in the atomic oscillator 1 according to the embodiment, the frequency also fluctuates when a fluctuation occurs in the electric field. For example, as illustrated in FIG. 6, in the atomic oscillator 1 according to the embodiment, a difference may occur in energy use transition from a use transition A to a use transition B. Therefore, in the atomic oscillator 1 according to the embodiment, it is necessary to stably apply a constant electric field. A method in the related art can be adopted to stably apply a constant electric field.

That is, the atomic oscillator 1 according to the embodiment generates the electric field to prevent a fluctuation caused by the magnetic field. When the electric field is generated, a fluctuation caused by the electric field may occur, but it is easy to prevent the fluctuation caused by the electric field compared to the fluctuation caused by the magnetic field. Therefore, the atomic oscillator 1 according to the embodiment is configured to prevent the fluctuation caused by the electric field as much as possible.

Here, spin Hamiltonian $H_{gs}$ when the electric field and the magnetic field are applied to the nitrogen-vacancy center in the diamond crystal is given by the following Equation 1.

$$H_{gs} = (hD_{gs} + d_{gs}{}^{\parallel}\Pi_z)\left[S_z{}^2 - \frac{1}{3}S(S+1)\right] + \mu_B g_e S \cdot B - d_{gs}{}^{\perp}\left[\Pi_x(S_xS_y + S_yS_x) + \Pi_y(S_x{}^2 - S_y{}^2)\right] \quad (1)$$

Figure 7:
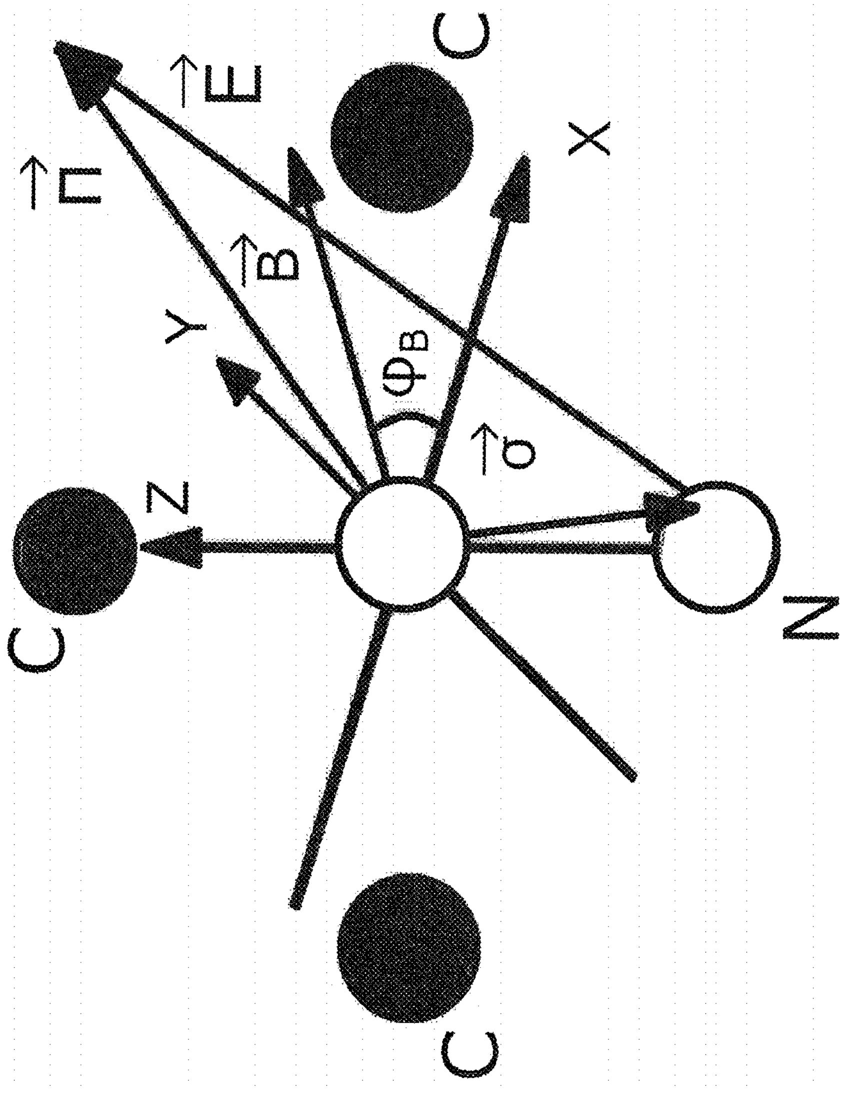
FIG. 7 is a diagram illustrating spin Hamiltonian when an electric field and a magnetic field are applied to the nitrogen-vacancy center in the diamond crystal.

Here, h is a Planck constant, $D_{gs}$ is a zero magnetic field splitting constant (about 2.87 GHz) in a ground state, $d_{gs}{}^{\parallel}$ and $d_{gs}{}^{\perp}$ are permanent electric dipole moments parallel and perpendicular to an axis that is a quantization axis of the NV center and couples N and V, respectively, $\Pi_x$, $\Pi_y$, and $\Pi_z$ are components of an electric field when x, y, and z axes are taken as illustrated in FIG. 7, respectively, $S=(S_x, S_y, S_z)$ are electron spin angular momentum operators, and $B=(B_x, B_y, B_z)$ is the magnetic field. S=1. When a natural energy value is obtained from the Hamiltonian, two types of resonance frequencies represented by the following Equation 2 are obtained. Then, when Equation 2 is plotted with respect to the magnetic field B, a solid line graph equivalent to FIG. 6 is obtained.

$$\hbar\Delta\omega_{\pm} = d_{gs}{}^{\parallel}E_z \pm [F(B, E, \sigma) - F(B, 0, \sigma)] \quad (2)$$

where $$F(B, E, \sigma) = \left[\mu_B^2 g_e^2 B_z^2 + d_{gs}{}^{\perp 2}\Pi_\perp^2 - \frac{\mu_B^2 g_e^2}{D_{gs}} B_\perp^2 d_{gs}{}^{\perp}\Pi_\perp \times \cos(2\phi_B + \phi_\Pi) + \frac{\mu_B^4 g_e^4}{4D_{gs}^2} B_\perp^4\right]^{1/2}$$

and $\Pi_\perp^2 = \Pi_x^2 + \Pi_y^2$, $B_\perp^2 = B_x^2 + B_y^2$, $\tan\varphi_\Pi = \Pi_y/\Pi_x$, and $\tan\varphi_B = B_y/B_x$.

Here, to briefly summarize from a viewpoint of the oscillation module 10, the oscillation module 10A and the oscillation module 10B according to the embodiment each include the diamond substrate 11 which is a substrate having a composite defect of an impurity and a vacancy, the plurality of electrodes 13 provided on the diamond substrate 11 and configured to generate an electric field when being applied with a voltage, the light source 17 which emits the excitation light for exciting the composite defect to the diamond substrate 11, and the fluorescence detector 4 configured to detect the fluorescence emitted from the diamond substrate 11. Since the oscillation module 10A and the oscillation module 10B according to the embodiment each have such a configuration, it is possible to prevent the magnetic field dependence of the energy level of the composite defect of the impurity and the vacancy by generating the electric field in the diamond substrate 11 while eliminating the necessity of using the gas to achieve a small size and a low power consumption, and it is possible to perform oscillation at a stable frequency, that is, oscillation with high accuracy in a state of preventing the magnetic field dependence.

In detail, in the embodiment, the composite defect of the impurity and the vacancy is the nitrogen-vacancy center (NV) in the diamond crystal, more specifically, the negatively charged nitrogen-vacancy center ($NV^-$), but the present disclosure is not limited to such a configuration. For example, a silicon-vacancy center (SiV) may be used.

The oscillation module 10A and the oscillation module 10B according to the embodiment each include, as a substrate, the diamond substrate 11 having a nitrogen-vacancy center as the composite defect. With such a configuration, it is possible to provide an oscillation module for implementing an atomic oscillator with high accuracy which is suitably small in size and low in power consumption. Although the diamond substrate 11 is used in the embodiment, the present disclosure is not limited to such a configuration. Any substrate having a wide band gap may be used, and for example, a silicon carbide (Sic) substrate may be used instead of the diamond substrate 11.

The oscillation module 10A and the oscillation module 10B according to the embodiment each include the microwave generator 15 configured to generate a microwave based on an input signal received from an outside. With such a configuration, the oscillation module 10A and the oscillation module 10B according to the embodiment can convert into an electromagnetic wave in a microwave region serving as the reference signal, and can suitably prevent a decrease in frequency stability.

In the oscillation module 10A and the oscillation module 10B according to the embodiment, the microwave generator 15 is provided on the diamond substrate 11. With such a configuration, the oscillation module 10A and the oscillation module 10B according to the embodiment can suitably convert into the electromagnetic wave in the microwave region.

In the oscillation module 10A and the oscillation module 10B according to the embodiment, the microwave generator 15 is provided between the electrode 13A and the electrode 13B which are the two electrodes 13. With such a configuration, the oscillation module 10A and the oscillation module 10B according to the embodiment can particularly suitably convert into the electromagnetic wave in the microwave region.

In the oscillation module 10A according to the embodiment, the microwave generator 15 is the coil 15A which is a coiled electric wire. In contrast, in the oscillation module 10B according to the embodiment, the microwave generator is the thin wire 15B which is a linear electric wire. As described above, the microwave generator 15 can be a coiled or linear electric wire. This is because the microwave generator 15 having a simple configuration and a small size can be obtained with such a configuration.

Here, in the oscillation module 10A and the oscillation module 10B according to the embodiment, the voltage to be applied to the electrode 13 is a DC voltage. With such a configuration, the oscillation frequency can be particularly stabilized.

Next, the atomic oscillator is summarized. The atomic oscillator 1 according to the embodiment includes the oscillation module 10 described above, the feedback circuit 5 configured to generate a feedback signal based on a detection signal output from the fluorescence detector 4, the controlled oscillator 2 serving as an oscillator configured to adjust the oscillation frequency based on the feedback signal, and the frequency multiplication circuit 3 configured to multiply the oscillation frequency of the controlled oscillator 2 and generate an input signal to be outputted to the oscillation module 10. With such a configuration, it is possible to implement the atomic oscillator 1 according to the embodiment as an atomic oscillator with high accuracy which is suitably small in size and low in power consumption.

In addition, the oscillation module 10A and the oscillation module 10B of the atomic oscillator 1 according to the embodiment each are an all-solid-state atomic oscillator in which each of components is formed of a solid. With such a configuration, it is possible to implement the atomic oscillator 1 according to the embodiment as an atomic oscillator with high accuracy which is particularly suitably small in size and low in power consumption.

As described above, by having the technical features of the atomic oscillator 1 according to the embodiment, it is possible to improve accuracy of the all-solid-state atomic oscillator. In addition, it is possible to implement an atomic oscillator with high accuracy which is small in size and low in power consumption compared to an atomic oscillator using a gas cell. In addition, by having the technical features of the atomic oscillator 1 according to the embodiment, it is possible to operate it at room temperature, which eliminates the need for heating as in the case of a gas cell, leading to low power consumption. Since the components are all solid, integration is easy compared to a gas cell, and it can be used to implement an ultra-compact atomic oscillator. For example, the present disclosure can be applied to time synchronization, in-vehicle timing devices, high-precision positioning devices, and wristwatches. From another viewpoint, by applying color centers in a diamond to an oscillator, it is possible to make the oscillator smaller and more integrated than atomic oscillators using gases in the related art. Further, a heating mechanism necessary for the atomic oscillator in the related art can be removed. Regarding the deterioration of frequency stability that seems to be an issue at that time, by applying a DC electric field from electrodes disposed on the diamond substrate, the nitrogen-vacancy center in the diamond crystal can be changed to become insensitive to the magnetic field, thereby preventing a decrease in frequency stability caused by magnetic field fluctuations in the external environment.

The present disclosure is not limited to the above-described embodiment and can be implemented in various configurations without departing from the gist of the present disclosure. For example, technical features in the embodiment corresponding to technical features in the aspects described in the summary can be substituted and combined as appropriate to solve a part or all of the problems described above or to achieve a part or all of the effects described above. The technical features can be deleted as appropriate unless described as essential technical features in the present specification.

What is claimed is:

1. An oscillation module comprising:

a substrate having a defect of an impurity and a vacancy;

a plurality of electrodes provided on the substrate and configured to generate an electric field by applying a voltage, wherein the voltage is a DC voltage;

a light source configured to emit excitation light for exciting the defect to the substrate; and a photodetector configured to detect fluorescence emitted from the substrate.

2. The oscillation module according to claim 1, wherein the substrate is a diamond substrate having a nitrogen-vacancy center as the defect.

3. The oscillation module according to claim 1, further comprising: a microwave generator configured to generate a microwave based on an input signal received from an outside of the oscillation module.

4. The oscillation module according to claim 3, wherein the microwave generator is provided on the substrate.

5. The oscillation module according to claim 4, wherein the microwave generator is provided between the plurality of electrodes.

6. The oscillation module according to claim 5, wherein the microwave generator is a coil or linear electric wire.

7. An atomic oscillator comprising:

the oscillation module according to claim 1;

a feedback circuit configured to generate a feedback signal based on a detection signal output from the photodetector;

an oscillator configured to adjust an oscillation frequency based on the feedback signal; and a frequency multiplication circuit configured to multiply the oscillation frequency of the oscillator and generate an input signal to be outputted to the oscillation module.

8. The atomic oscillator according to claim 7, wherein the oscillation module is an all-solid-state atomic oscillator.

* * * * *